(12) United States Patent
Savtchenko et al.

(10) Patent No.: US 7,184,300 B2
(45) Date of Patent: Feb. 27, 2007

(54) MAGNETO RESISTANCE RANDOM ACCESS MEMORY ELEMENT

(75) Inventors: Leonid Savtchenko, deceased, late of Chandler, AZ (US); by Anatoli Korkin, legal representative, Gilbert, AZ (US); Bradley N. Engel, Chandler, AZ (US); Nicholas D. Rizzo, Gilbert, AZ (US); Mark F. Deherrera, Tempe, AZ (US); Jason Allen Janesky, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/339,378

(22) Filed: Jan. 9, 2003

(65) Prior Publication Data

US 2003/0128603 A1    Jul. 10, 2003

(51) Int. Cl.
*G11C 11/00* (2006.01)
(52) U.S. Cl. .................... 365/158; 365/171; 365/173
(58) Field of Classification Search ............ 365/158 O, 365/171 X, 173 X, 48, 50, 55, 180
See application file for complete search history.

(56) References Cited

U.S. PATENT DOCUMENTS

| | | | |
|---|---|---|---|
| 3,163,853 A | 12/1964 | Belson | |
| 3,448,438 A | 6/1969 | Hansen et al. | |
| 3,573,760 A | 4/1971 | Chang et al. | |
| 3,638,199 A | 1/1972 | Kolankowsky et al. | |
| 3,707,706 A | 12/1972 | Kefalas | |
| 3,913,080 A | 10/1975 | Leo et al. | |
| 4,103,315 A | 7/1978 | Hempstead et al. | |
| 4,351,712 A | 9/1982 | Cuomo et al. | |
| 4,356,523 A | 10/1982 | Yeh | |
| 4,455,626 A | 6/1984 | Lutes | |
| 4,556,925 A | 12/1985 | Suenaga et al. | |
| 4,663,685 A | 5/1987 | Tsang | |
| 4,719,568 A | 1/1988 | Carrubba et al. | |
| 4,731,757 A | 3/1988 | Daughton et al. | |
| 4,751,677 A | 6/1988 | Daughton et al. | |
| 4,754,431 A | 6/1988 | Jenson | |

(Continued)

FOREIGN PATENT DOCUMENTS

DE    43 27 458    8/1993

(Continued)

OTHER PUBLICATIONS

Pohm et al., "Analysis of 0.1 to 0.3 Micron Wide, Ultra Dense GMR Memory Elements," IEEE Transactions on Magnetics, Bd. 30, Nr. 6, Nov. 1994, 4650-4652.

(Continued)

*Primary Examiner*—VanThu Nguyen
(74) *Attorney, Agent, or Firm*—Ingrassia Fisher & Lorenz (57) ABSTRACT

A method to switch a scalable magnetoresistive memory cell including the steps of providing a magnetoresistive memory device sandwiched between a word line and a digit line so that current waveforms can be applied to the word and digit lines at various times to cause a magnetic field flux to rotate the effective magnetic moment vector of the device by approximately 180°. The magnetoresistive memory device includes N ferromagnetic layers that are anti-ferromagnetically coupled. N can be adjusted to change the magnetic switching volume of the device.

43 Claims, 5 Drawing Sheets

U.S. PATENT DOCUMENTS

| | | |
|---|---|---|
| 4,780,848 A | 10/1988 | Daughton et al. |
| 4,825,325 A | 4/1989 | Howard |
| 4,884,235 A | 11/1989 | Thiele |
| 5,039,655 A | 8/1991 | Pisharody |
| 5,075,247 A | 12/1991 | Matthews |
| 5,159,513 A | 10/1992 | Dieny et al. |
| 5,173,873 A | 12/1992 | Wu et al. |
| 5,258,884 A | 11/1993 | Howard et al. |
| 5,268,806 A | 12/1993 | Goubau et al. |
| 5,284,701 A | 2/1994 | Hamon |
| 5,285,339 A | 2/1994 | Chen et al. |
| 5,301,079 A | 4/1994 | Cain et al. |
| 5,329,486 A | 7/1994 | Lage |
| 5,343,422 A | 8/1994 | Kung et al. |
| 5,346,302 A | 9/1994 | Ryu |
| 5,347,485 A | 9/1994 | Taguchi et al. |
| 5,348,894 A | 9/1994 | Gnade et al. |
| 5,349,302 A | 9/1994 | Cooper |
| 5,361,226 A | 11/1994 | Taguchi et al. |
| 5,375,082 A | 12/1994 | Katti et al. |
| 5,396,455 A | 3/1995 | Brady et al. |
| 5,398,200 A | 3/1995 | Mazure et al. |
| 5,408,377 A | 4/1995 | Gurney et al. |
| 5,420,819 A | 5/1995 | Pohm |
| 5,432,734 A | 7/1995 | Kawano et al. |
| 5,442,508 A | 8/1995 | Smith |
| 5,448,515 A | 9/1995 | Fukami et al. |
| 5,452,243 A | 9/1995 | Ansel et al. |
| 5,468,985 A | 11/1995 | Harima |
| 5,475,825 A | 12/1995 | Yonezawa et al. |
| 5,477,842 A | 12/1995 | Maruyama et al. |
| 5,496,759 A | 3/1996 | Yue et al. |
| 5,498,561 A | 3/1996 | Sakuma et al. |
| 5,528,440 A | 6/1996 | Fontana et al. |
| 5,534,355 A | 7/1996 | Okuno et al. |
| 5,534,793 A | 7/1996 | Nasserbakht |
| 5,541,868 A | 7/1996 | Prinz |
| 5,567,523 A | 10/1996 | Rosenblum et al. |
| 5,569,617 A | 10/1996 | Yeh et al. |
| 5,585,986 A | 12/1996 | Parkin |
| 5,587,943 A | 12/1996 | Torok et al. |
| 5,617,071 A | 4/1997 | Daughton |
| 5,636,093 A | 6/1997 | Gijs et al. |
| 5,640,343 A | 6/1997 | Gallagher et al. |
| 5,650,958 A | 7/1997 | Gallagher et al. |
| 5,659,499 A | 8/1997 | Chen et al. |
| 5,661,062 A | 8/1997 | Prinz |
| 5,673,162 A | 9/1997 | Saito |
| 5,699,293 A | 12/1997 | Tehrani et al. |
| 5,702,831 A | 12/1997 | Chen et al. |
| 5,712,612 A | 1/1998 | Lee et al. |
| 5,715,121 A | 2/1998 | Sakakima et al. |
| 5,729,410 A | 3/1998 | Fontana, Jr. et al. |
| 5,732,016 A | 3/1998 | Chen et al. |
| 5,734,605 A | 3/1998 | Zhu et al. |
| 5,745,408 A | 4/1998 | Chen et al. |
| 5,748,519 A | 5/1998 | Tehrani et al. |
| 5,757,056 A | 5/1998 | Chui |
| 5,761,110 A | 6/1998 | Irrinki et al. |
| 5,764,567 A | 6/1998 | Parkin |
| 5,766,743 A | 6/1998 | Fujikata et al. |
| 5,768,181 A | 6/1998 | Zhu et al. |
| 5,774,394 A | 6/1998 | Chen et al. |
| 5,774,404 A | 6/1998 | Eto |
| 5,786,275 A | 7/1998 | Kubo |
| 5,801,984 A | 9/1998 | Parkin |
| 5,804,250 A | 9/1998 | Yang |
| 5,804,485 A | 9/1998 | Liang |
| 5,825,685 A | 10/1998 | Yamane et al. |
| 5,828,578 A | 10/1998 | Blomgren |
| 5,831,920 A | 11/1998 | Chen et al. |
| 5,832,534 A | 11/1998 | Sing et al. |
| 5,835,314 A | 11/1998 | Moodera et al. |
| 5,838,608 A | 11/1998 | Zhu et al. |
| 5,852,574 A | 12/1998 | Naji |
| 5,856,008 A | 1/1999 | Cheong et al. |
| 5,861,328 A | 1/1999 | Tehrani et al. |
| 5,892,708 A | 4/1999 | Pohm |
| 5,894,447 A | 4/1999 | Takashima |
| 5,898,612 A | 4/1999 | Chen et al. |
| 5,902,690 A | 5/1999 | Tracy et al. |
| 5,905,996 A | 5/1999 | Pawlowski |
| 5,907,784 A | 5/1999 | Larson |
| 5,917,749 A | 6/1999 | Chen et al. |
| 5,920,500 A | 7/1999 | Tehrani et al. |
| 5,926,414 A | 7/1999 | McDowell et al. |
| 5,930,164 A | 7/1999 | Zhu |
| 5,932,343 A | 8/1999 | Hayashi et al. |
| 5,940,319 A | 8/1999 | Durlam et al. |
| 5,943,284 A | 8/1999 | Mizuno et al. |
| 5,943,574 A | 8/1999 | Tehrani et al. |
| 5,946,227 A | 8/1999 | Naji |
| 5,946,228 A | 8/1999 | Abraham et al. |
| 5,948,553 A | 9/1999 | Kamijo |
| 5,949,622 A | 9/1999 | Kamiguchi et al. |
| 5,949,696 A | 9/1999 | Threewitt |
| 5,953,248 A * | 9/1999 | Chen et al. ................. 365/158 |
| 5,955,211 A | 9/1999 | Maeda et al. |
| 5,956,267 A | 9/1999 | Hurst et al. |
| 5,959,880 A | 9/1999 | Shi et al. |
| 5,966,012 A | 10/1999 | Parkin |
| 5,966,323 A | 10/1999 | Chen et al. |
| 5,976,713 A | 11/1999 | Fuke et al. |
| 5,978,257 A | 11/1999 | Zhu et al. |
| 5,982,660 A | 11/1999 | Bhattacharyya et al. |
| 5,985,356 A | 11/1999 | Schultz et al. |
| 5,985,365 A | 11/1999 | Jaye |
| 5,986,858 A | 11/1999 | Sato et al. |
| 5,986,925 A | 11/1999 | Naji et al. |
| 5,990,011 A | 11/1999 | McTeer |
| 5,998,040 A | 12/1999 | Nakatani et al. |
| 6,004,654 A | 12/1999 | Shinjo et al. |
| 6,005,753 A | 12/1999 | Fontana, Jr. et al. |
| 6,016,269 A | 1/2000 | Peterson et al. |
| 6,023,395 A | 2/2000 | Dill et al. |
| 6,048,739 A | 4/2000 | Hurst et al. |
| 6,052,302 A * | 4/2000 | Moyer et al. ................ 365/173 |
| 6,052,303 A | 4/2000 | Chevallier et al. |
| 6,054,226 A | 4/2000 | Takeda et al. |
| 6,055,178 A | 4/2000 | Naji |
| 6,055,179 A | 4/2000 | Koganei et al. |
| 6,069,820 A | 5/2000 | Inomata et al. |
| 6,072,718 A | 6/2000 | Abraham et al. |
| 6,083,764 A | 7/2000 | Chen |
| 6,097,625 A | 8/2000 | Scheuerlein |
| 6,097,626 A | 8/2000 | Brug et al. |
| 6,111,784 A | 8/2000 | Nishimura |
| 6,114,719 A | 9/2000 | Dill et al. |
| 6,120,842 A | 9/2000 | Lu et al. |
| 6,127,045 A | 10/2000 | Gill |
| 6,134,060 A | 10/2000 | Ryat |
| 6,134,139 A | 10/2000 | Bhattacharyya et al. |
| 6,145,055 A | 11/2000 | Fujimoto |
| 6,163,477 A | 12/2000 | Tran |
| 6,165,803 A | 12/2000 | Chen et al. |
| 6,166,948 A | 12/2000 | Parkin et al. |
| 6,169,687 B1 | 1/2001 | Johnson |
| 6,169,689 B1 * | 1/2001 | Naji ........................... 365/173 |
| 6,172,903 B1 | 1/2001 | Nishimura |
| 6,175,475 B1 | 1/2001 | Lin et al. |
| 6,175,515 B1 | 1/2001 | Peczalski et al. |
| 6,178,074 B1 | 1/2001 | Gill |
| 6,178,112 B1 | 1/2001 | Bessho et al. |
| 6,180,444 B1 | 1/2001 | Gates et al. |

| | | |
|---|---|---|
| 6,185,143 B1 | 2/2001 | Perner et al. |
| 6,188,549 B1 | 2/2001 | Wiitala |
| 6,189,077 B1 | 2/2001 | Robertson et al. |
| 6,191,972 B1 | 2/2001 | Miura et al. |
| 6,195,240 B1 | 2/2001 | Gill |
| 6,198,610 B1 | 3/2001 | Kawawake et al. |
| 6,205,051 B1 | 3/2001 | Brug et al. |
| 6,205,052 B1 | 3/2001 | Slaughter et al. |
| 6,205,073 B1 | 3/2001 | Naji |
| 6,211,090 B1 | 4/2001 | Durlam et al. |
| 6,232,777 B1 | 5/2001 | Sato et al. |
| 6,233,172 B1 | 5/2001 | Chen et al. |
| 6,249,406 B1 | 6/2001 | Gill et al. |
| 6,256,247 B1 | 7/2001 | Perner |
| 6,259,586 B1 | 7/2001 | Gill |
| 6,269,018 B1 | 7/2001 | Monsma et al. |
| 6,269,040 B1 | 7/2001 | Reohr et al. |
| 6,272,040 B1 | 8/2001 | Salter et al. |
| 6,275,363 B1 | 8/2001 | Gill |
| 6,277,762 B1 | 8/2001 | Hwang |
| 6,278,631 B1 | 8/2001 | Naji |
| 6,281,538 B1 | 8/2001 | Slaughter |
| 6,285,581 B1 | 9/2001 | Tehrani et al. |
| 6,292,336 B1 | 9/2001 | Horng et al. |
| 6,292,389 B1 | 9/2001 | Chen et al. |
| 6,295,225 B1 | 9/2001 | Oepts |
| 6,313,973 B1 | 11/2001 | Fuke et al. |
| 6,314,020 B1 | 11/2001 | Hansen et al. |
| 6,317,299 B1 | 11/2001 | Pinarbasi |
| 6,317,376 B1 | 11/2001 | Tran et al. |
| 6,322,640 B1 | 11/2001 | Xiao et al. |
| 6,330,137 B1 | 12/2001 | Knapp et al. |
| 6,331,943 B1 | 12/2001 | Naji et al. |
| 6,331,944 B1 | 12/2001 | Monsma et al. |
| 6,338,899 B1 | 1/2002 | Fukuzawa et al. |
| 6,341,053 B1 | 1/2002 | Nakada et al. |
| 6,341,084 B2 | 1/2002 | Numata et al. |
| 6,343,032 B1 | 1/2002 | Black et al. |
| 6,344,954 B1 | 2/2002 | Redon et al. |
| 6,351,408 B1 | 2/2002 | Schwarzl et al. |
| 6,351,409 B1 | 2/2002 | Rizzo et al. |
| 6,358,756 B1 | 3/2002 | Sandhu et al. |
| 6,359,805 B1 | 3/2002 | Hidaka |
| 6,363,007 B1 * | 3/2002 | Lu et al. ..................... 365/158 |
| 6,366,494 B2 | 4/2002 | Weber et al. |
| 6,379,978 B2 | 4/2002 | Goebel et al. |
| 6,383,574 B1 | 5/2002 | Han et al. |
| 6,385,109 B1 | 5/2002 | Naji |
| 6,388,917 B2 | 5/2002 | Hoffmann |
| 6,389,524 B1 | 5/2002 | Sato |
| 6,392,922 B1 | 5/2002 | Liu et al. |
| 6,392,923 B1 | 5/2002 | Naji |
| 6,392,924 B1 | 5/2002 | Liu et al. |
| 6,396,735 B2 * | 5/2002 | Michijima et al. .......... 365/173 |
| 6,404,674 B1 | 6/2002 | Anthony et al. |
| 6,418,046 B1 | 7/2002 | Naji |
| 6,424,562 B1 | 7/2002 | Rosner et al. |
| 6,429,497 B1 | 8/2002 | Nickel |
| 6,430,084 B1 | 8/2002 | Rizzo et al. |
| 6,436,526 B1 | 8/2002 | Odagawa et al. |
| 6,445,612 B1 | 9/2002 | Naji |
| 6,449,133 B1 | 9/2002 | Makino et al. |
| 6,469,878 B1 | 10/2002 | Mack et al. |
| 6,473,335 B2 | 10/2002 | Bohm et al. |
| 6,475,812 B2 | 11/2002 | Nickel et al. |
| 6,487,110 B2 | 11/2002 | Nishimura et al. |
| 6,493,259 B1 | 12/2002 | Swanson et al. |
| 6,501,144 B1 | 12/2002 | Rizzo |
| 6,515,895 B2 | 2/2003 | Naji |
| 6,531,723 B1 | 3/2003 | Engel et al. |
| 6,538,919 B1 | 3/2003 | Abraham et al. |
| 6,545,906 B1 | 4/2003 | Savtchenko |
| 6,556,473 B2 | 4/2003 | Saito et al. |
| 6,567,246 B1 | 5/2003 | Sakakima et al. |
| 6,633,498 B1 | 10/2003 | Engel et al. |
| 6,674,662 B1 | 1/2004 | Hillebrands et al. |
| 2001/0026470 A1 | 10/2001 | Gillies et al. |
| 2001/0035545 A1 | 11/2001 | Schuster-Woldan et al. |
| 2001/0050859 A1 | 12/2001 | Siegfried |
| 2002/0024780 A1 | 2/2002 | Mao et al. |
| 2002/0036331 A1 | 3/2002 | Nickel et al. |
| 2002/0036919 A1 | 3/2002 | Daughton et al. |
| 2002/0039308 A1 | 4/2002 | Gogl et al. |
| 2002/0044396 A1 | 4/2002 | Amano et al. |
| 2002/0048185 A1 | 4/2002 | Thewes et al. |
| 2002/0058158 A1 | 5/2002 | Odagawa et al. |
| 2002/0080644 A1 | 6/2002 | Ito |
| 2002/0080661 A1 | 6/2002 | Gogl et al. |
| 2002/0089024 A1 | 7/2002 | Iwata |
| 2002/0097540 A1 | 7/2002 | Hayashi et al. |
| 2002/0097602 A1 | 7/2002 | Lammers |
| 2002/0154539 A1 | 10/2002 | Swanson et al. |
| 2002/0159203 A1 | 10/2002 | Saito et al. |
| 2003/0042562 A1 | 3/2003 | Giebler et al. |
| 2003/0072174 A1 | 4/2003 | Savtchenko et al. |
| 2003/0089933 A1 | 5/2003 | Janesky et al. |

FOREIGN PATENT DOCUMENTS

| | | |
|---|---|---|
| DE | 198 30 343 | 7/1998 |
| EP | 0 068 760 | 10/1985 |
| EP | 0 279 537 | 12/1993 |
| EP | 0 613 148 | 1/1994 |
| EP | 0 335 715 | 7/1995 |
| EP | 0 773 551 | 5/1997 |
| EP | 0 962 939 | 6/1999 |
| EP | 0 936 624 | 8/1999 |
| EP | 0 971 424 | 1/2000 |
| EP | 0 992 984 | 4/2000 |
| EP | 1 061 592 | 12/2000 |
| EP | 0 768 672 | 4/2001 |
| EP | 1 094 467 | 4/2001 |
| EP | 1 109 068 | 6/2001 |
| EP | 1 109 170 | 6/2001 |
| EP | 0 624 868 | 8/2001 |
| EP | 1 126 531 | 8/2001 |
| EP | 1 168 355 | 1/2002 |
| EP | 1 298 669 | 4/2003 |
| EP | 0 929 110 | 12/2003 |
| GB | 1 052 646 | 3/1965 |
| JP | 01 214077 | 2/1988 |
| JP | 02 288209 | 4/1989 |
| JP | 06 061293 | 3/1994 |
| JP | 09 050611 | 12/1995 |
| JP | 09 199769 | 1/1996 |
| JP | 08 096328 | 4/1996 |
| JP | 08 321739 | 12/1996 |
| JP | 09 306159 | 11/1997 |
| JP | 09 306733 | 11/1997 |
| JP | 09 325746 | 12/1997 |
| JP | 10 004226 | 1/1998 |
| JP | 10 162326 | 6/1998 |
| JP | 10 162568 | 6/1998 |
| JP | 10 270776 | 10/1998 |
| JP | 11 039858 | 2/1999 |
| JP | 11 316913 | 11/1999 |
| JP | 2000 090418 | 3/2000 |
| JP | 2000 123325 | 4/2000 |
| JP | 2000 132961 | 5/2000 |
| JP | 2000 286478 | 10/2000 |
| JP | 2001 068760 | 3/2001 |
| JP | 2001 084756 | 3/2001 |
| JP | 2002 141481 | 5/2002 |
| JP | 2002 170374 | 6/2002 |
| JP | 2002 334585 | 11/2002 |
| WO | WO 93/09541 | 5/1993 |

| WO | WO 96/41379 | 12/1996 |
| WO | WO 99/18578 | 9/1998 |
| WO | WO 98/47613 | 10/1998 |
| WO | WO 00/04551 | 1/2000 |
| WO | WO 00/058970 | 10/2000 |
| WO | WO 02/41367 | 5/2002 |
| WO | WO 02/073620 | 9/2002 |

OTHER PUBLICATIONS

Pohm et al., "The Architecture of a High Performance Mass Store With GMR Memory Cells," IEEE Transactions on Magnetics, Bd. 31, Nr. 6, Nov. 1995, 3200-3202.

Pohm et al., "Demagnetization Effects on Forward and Reverse Thresholds of M-R Memory Elements," Journal of Applied Physics, Bd. 69, Nr. 8, 5763-5764.

Pohm et al., The Energy and Width of Paired Neel Walls in Double Layer M-R Films, IEEE Transactions on Magnetics, Bd. 26, Nr. 5, Sep. 1990, 2831-2833.

Pohm et al., "Experimental and Analytical Properties of 0.2 Micron Wide, Multi-Layer, GMR, Memory Elements," IEEE Transactions on Magnetics, Bd. 32, Nr. 5, Sep. 1996, 4645-1647.

Pohm et. al., "Future Projections and Capabilities of GMR NV Memory," IEEE International Nonvolatile Memory Technology Conference, Jun. 24-26, 1996, 113-115.

Tehrani et al., "High Density Nonvolatile Magnetoresistive RAM," International Electron Devices Meeting, Dec. 1996, 193-196.

Comstock et al., "Perturbations to the Stoner-Wohlfarth Threshold in 2×20 UM M-R Memory Elements," Journal of Applied Physics, Bd. 63, Nr. 8, Apr. 15, 1988, 4321-4323.

Beech et al., "Simulation of Sub-Micron GMR Memory Cells," IEEE Transactions on Magnetics, Bd. 31, Nr. 6, Nov. 1995, 3200-3202.

Tang et al., "Spin-Valve RAM Cell," IEEE Transactions on Magnetics, Bd. 31, Nr. 6, Nov. 1995, 3206-3208.

Yoo et al., "2-Dimensional Numerical Analysis of Laminated Thin Film Elements," IEEE Transactions on Magnetics, Bd. 24, Nr. 6, Nov. 1988, 2377-2379.

Uhm, Y.R.; Lim, S.H.; "Computer Simulation of Switching Characteristics in Magnetic Tunnel Junctions Exchange-Biased by Synthetic Antiferromagnets"; Taipei, Taiwan, May 13-16, 2001, vol. 239, No. 1-3, pp. 123-125; Journal of Magnetism and Magnetic Materials, Feb. 2002, Elsevier, Netherlands.

Uhm et al., "Computer Simulation of Switching Characteristics in Magnetic Tunnel Junctions Exchange-Biased by Synthetic Antiferromagnets, " Journal of Magnetism and Magnetic Materials, vol. 239, Issues 1-3, Feb. 2002, pp. 123-125.

* cited by examiner

MAGNETO RESISTANCE RANDOM ACCESS MEMORY ELEMENT

This invention was made with Government support under Agreement No. MDA972-96-3-0016 awarded by DARPA. The Government has certain rights in the invention.

FIELD OF THE INVENTION

This invention relates to semiconductor memory devices. More particularly, the present invention relates to semiconductor random access memory devices that utilize a magnetic field.

BACKGROUND OF THE INVENTION

Non-volatile memory devices are an extremely important component in electronic systems. FLASH is the major non-volatile memory device in use today. Typical non-volatile memory devices use charges trapped in a floating oxide layer to store information. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, magnetic memory devices are being evaluated. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of the magnetic moment vector. Storing data is accomplished by applying magnetic fields and causing a magnetic material in a MRAM device to be magnetized into either of two possible memory states. Recalling data is accomplished by sensing the resistive differences in the MRAM device between the two states. The magnetic fields for writing are created by passing currents through strip lines external to the magnetic structure or through the magnetic structures themselves.

As the lateral dimension of an MRAM device decreases, three problems occur. First, the switching field increases for a given shape and film thickness, requiring a larger magnetic field to switch. Second, the total switching volume is reduced so that the energy barrier for reversal decreases. The energy barrier refers to the amount of energy needed to switch the magnetic moment vector from one state to the other. The energy barrier determines the data retention and error rate of the MRAM device and unintended reversals can occur due to thermofluctuations (superparamagnetism) if the barrier is too small. A major problem with having a small energy barrier is that it becomes extremely difficult to selectively switch one MRAM device in an array. Selectablity allows switching without inadvertently switching other MRAM devices. Finally, because the switching field is produced by shape, the switching field becomes more sensitive to shape variations as the MRAM device decreases in size. With photolithography scaling becoming more difficult at smaller dimensions, MRAM devices will have difficulty maintaining tight switching distributions.

It would be highly advantageous, therefore, to remedy the foregoing and other deficiencies inherent in the prior art.

Accordingly, it is an object of the present invention to provide a new and improved method of writing to a magnetoresistive random access memory device.

It is an object of the present invention to provide a new and improved method of writing to a magnetoresistive random access memory device which is highly selectable.

It is another object of the present invention to provide a new and improved method of writing to a magnetoresistive random access memory device which has an improved error rate.

It is another object of the present invention to provide a new and improved method of writing to a magnetoresistive random access memory device which has a switching field that is less dependant on shape.

SUMMARY OF THE INVENTION

To achieve the objects and advantages specified above and others, a method of writing to a scalable magnetoresistive memory array is disclosed. The memory array includes a number of scalable magnetoresistive memory devices. For simplicity, we will look at how the writing method applies to a single MRAM device, but it will be understood that the writing method applies to any number of MRAM devices.

The MRAM device used to illustrate the writing method includes a word line and a digit line positioned adjacent to a magnetoresistive memory element. The magnetoresistive memory element includes a pinned magnetic region positioned adjacent to the digit line. A tunneling barrier is positioned on the pinned magnetic region. A free magnetic region is then positioned on the tunneling barrier and adjacent to the word line. In the preferred embodiment, the pinned magnetic region has a resultant magnetic moment vector that is fixed in a preferred direction. Also, in the preferred embodiment, the free magnetic region includes synthetic anti-ferromagnetic (hereinafter referred to as "SAF") layer material. The synthetic anti-ferromagnetic layer material includes N anti-ferromagnetically coupled layers of a ferromagnetic material, where N is a whole number greater than or equal to two. The N layers define a magnetic switching volume that can be adjusted by changing N. In the preferred embodiment, the N ferromagnetic layers are anti-ferromagnetically coupled by sandwiching an anti-ferromagnetic coupling spacer layer between each adjacent ferromagnetic layer. Further, each N layer has a moment adjusted to provide an optimized writing mode.

In the preferred embodiment, N is equal to two so that the synthetic anti-ferromagnetic layer material is a tri-layer structure of a ferromagnetic layer/anti-ferromagnetic coupling spacer layer/ferromagnetic layer. The two ferromagnetic layers in the tri-layer structure have magnetic moment vectors $M_1$ and $M_2$, respectively, and the magnetic moment vectors are usually oriented anti-parallel by the coupling of the anti-ferromagnetic coupling spacer layer. Anti-ferromagnetic coupling is also generated by the magnetostatic fields of the layers in the MRAM structure. Therefore, the spacer layer need not necessarily provide any additional antiferromagnetic coupling beyond eliminating the ferromagnetic coupling between the two magnetic layers. More information as to the MRAM device used to illustrate the writing method can be found in a copending U.S. patent application entitled "Magnetoresistance Random Access Memory for Improved Scalability" filed of even date herewith, and incorporated herein by reference.

The magnetic moment vectors in the two ferromagnetic layers in the MRAM device can have different thicknesses or material to provide a resultant magnetic moment vector given by $\Delta M=(M_2-M_1)$ and a sub-layer moment fractional balance ratio, $$M_{br} = \frac{(M_2 - M_1)}{(M_2 + M_1)} = \frac{\Delta M}{M_{total}}.$$

The resultant magnetic moment vector of the tri-layer structure is free to rotate with an applied magnetic field. In zero field the resultant magnetic moment vector will be stable in a direction, determined by the magnetic anisotropy, that is either parallel or anti-parallel with respect to the resultant magnetic moment vector of the pinned reference layer. It will be understood that the term "resultant magnetic moment vector" is used only for purposes of this description and for the case of totally balanced moments, the resultant magnetic moment vector can be zero in the absence of a magnetic field. As described below, only the sub-layer magnetic moment vectors adjacent to the tunnel barrier determine the state of the memory.

The current through the MRAM device depends on the tunneling magnetoresistance, which is governed by the relative orientation of the magnetic moment vectors of the free and pinned layers directly adjacent to the tunneling barrier. If the magnetic moment vectors are parallel, then the MRAM device resistance is low and a voltage bias will induce a larger current through the device. This state is defined as a "1". If the magnetic moment vectors are anti-parallel, then the MRAM device resistance is high and an applied voltage bias will induce a smaller current through the device. This state is defined as a "0". It will be understood that these definitions are arbitrary and could be reversed, but are used in this example for illustrative purposes. Thus, in magnetoresistive memory, data storage is accomplished by applying magnetic fields that cause the magnetic moment vectors in the MRAM device to be orientated either one of parallel and anti-parallel directions relative to the magnetic moment vector in the pinned reference layer.

The method of writing to the scalable MRAM device relies on the phenomenon of "spin-flop" for a nearly balanced SAF tri-layer structure. Here, the term "nearly balanced" is defined such that the magnitude of the sub-layer moment fractional balance ratio is in the range $0 \leq |M_{br}| \leq 0.1$. The spin-flop phenomenon lowers the total magnetic energy in an applied field by rotating the magnetic moment vectors of the ferromagnetic layers so that they are nominally orthogonal to the applied field direction but still predominantly anti-parallel to one another. The rotation, or flop, combined with a small deflection of each ferromagnetic magnetic moment vector in the direction of the applied field accounts for the decrease in total magnetic energy.

In general, using the flop phenomenon and a timed pulse sequence, the MRAM device can be written to using two distinct modes; a direct write mode or a toggle write mode. These modes are achieved using the same timed pulse sequence as will be described, but differ in the choice of magnetic sub-layer moment and polarity and magnitude of the magnetic field applied.

Each writing method has its advantages. For example, when using the direct write mode, there is no need to determine the initial state of the MRAM device because the state is only switched if the state being written is different from the state that is stored. Although the direct writing method does not require knowledge of the state of the MRAM device before the writing sequence is initiated, it does require changing the polarity of both the word and digit line depending on which state is desired.

When using the toggle writing method, there is a need to determine the initial state of the MRAM device before writing because the state will be switched every time the same polarity pulse sequence is generated from both the word and digit lines. Thus, the toggle write mode works by reading the stored memory state and comparing that state with the new state to be written. After comparison, the MRAM device is only written to if the stored state and the new state are different.

The MRAM device is constructed such that the magnetic anisotropy axis is ideally at a 45° angle to the word and digit lines. Hence, the magnetic moment vectors $M_1$ and $M_2$ are oriented in a preferred direction at a 45° angle to the directions of the word line and digit line at a time $t_0$. As an example of the writing method, to switch the state of the MRAM device using either a direct or toggle write, the following current pulse sequence is used. At a time $t_1$, the word current is increased and $M_1$ and $M_2$ begin to rotate either clockwise or counterclockwise, depending on the direction of the word current, to align themselves nominally orthogonal to the field direction due to the spin-flop effect. At a time $t_2$, the digit current is switched on. The digit current flows in a direction such that $M_1$ and $M_2$ are further rotated in the same direction as the rotation caused by the digit line magnetic field. At this point in time, both the word line current and the digit line current are on, with $M_1$ and $M_2$ being nominally orthogonal to the net magnetic field direction, which is 45° with respect to the current lines.

It is important to realize that when only one current is on, the magnetic field will cause $M_1$ and $M_2$ to align nominally in a direction parallel to either the word line or digit line. However, if both currents are on, then $M_1$ and $M_2$ will align nominally orthogonal to a 45° angle to the word line and digit line.

At a time $t_3$, the word line current is switched off, so that $M_1$ and $M_2$ are being rotated only by the digit line magnetic field. At this point, $M_1$ and $M_2$ have generally been rotated past their hard-axis instability points. At a time $t_4$, the digit line current is switched off and $M_1$ and $M_2$ will align along the preferred anisotropy axis. At this point in time, $M_1$ and $M_2$ have been rotated 180° and the MRAM device has been switched. Thus, by sequentially switching the word and digit currents on and off, $M_1$ and $M_2$ of the MRAM device can be rotated by 180° so that the state of the device is switched.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 4 is a graph illustrating the timing diagram of the word current and the digit current when both are turned on;

FIG. 9 is a graph illustrating the timing diagram of the word current and the digit current when only the digit current is turned on; and FIG. 10 is a graph illustrating the rotation of the magnetic moment vectors for a magnetoresistive random access memory device when only the digit current is turned on.

DETAILED DESCRIPTION OF THE PREFERRED EMBODIMENT

Figure 1:
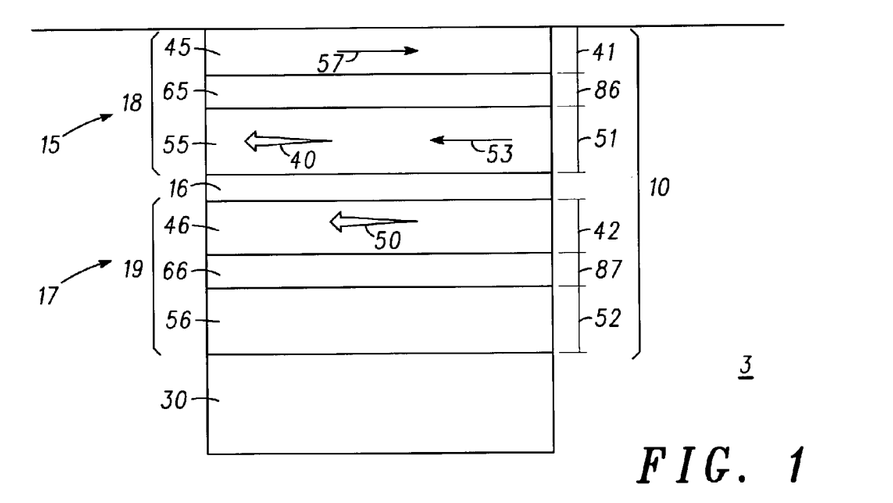
FIG. 1 is a simplified sectional view of a magnetoresistive random access memory device.

Turn now to FIG. 1, which illustrates a simplified sectional view of an MRAM array 3 in accordance with the present invention. In this illustration, only a single magnetoresistive memory device 10 is shown, but it will be understood that MRAM array 3 consists of a number of MRAM devices 10 and we are showing only one such device for simplicity in describing the writing method.

MRAM device 10 is sandwiched therebetween a word line 20 and a digit line 30. Word line 20 and digit line 30 include conductive material such that a current can be passed therethrough. In this illustration, word line 20 is positioned on top of MRAM device 10 and digit line 30 is positioned on the bottom of MRAM device 10 and is directed at a 90° angle to word line 20 (See FIG. 2).

MRAM device 10 includes a first magnetic region 15, a tunneling barrier 16, and a second magnetic region 17, wherein tunneling barrier 16 is sandwiched therebetween first magnetic region 15 and second magnetic region 17. In the preferred embodiment, magnetic region 15 includes a tri-layer structure 18, which has an anti-ferromagnetic coupling spacer layer 65 sandwiched therebetween two ferromagnetic layers 45 and 55. Anti-ferromagnetic coupling spacer layer 65 has a thickness 86 and ferromagnetic layers 45 and 55 have thicknesses 41 and 51, respectively. Further, magnetic region 17 has a tri-layer structure 19, which has an anti-ferromagnetic coupling spacer layer 66 sandwiched therebetween two ferromagnetic layers 46 and 56. Anti-ferromagnetic coupling spacer layer 66 has a thickness 87 and ferromagnetic layers 46 and 56 have thicknesses 42 and 52, respectively.

Generally, anti-ferromagnetic coupling spacer layers 65 and 66 include at least one of the elements Ru, Os, Re, Cr, Rh, Cu, or combinations thereof. Further, ferromagnetic layers 45, 55, 46, and 56 include at least one of elements Ni, Fe, Mn, Co, or combinations thereof. Also, it will be understood that magnetic regions 15 and 17 can include synthetic anti-ferromagnetic layer material structures other than tri-layer structures and the use of tri-layer structures in this embodiment is for illustrative purposes only. For example, one such synthetic anti-ferromagnetic layer material structure could include a five-layer stack of a ferromagnetic layer/anti-ferromagnetic coupling spacer layer/ferromagnetic layer/anti-ferromagnetic coupling spacer layer/ferromagnetic layer structure.

Ferromagnetic layers 45 and 55 each have a magnetic moment vector 57 and 53, respectively, that are usually held anti-parallel by coupling of the anti-ferromagnetic coupling spacer layer 65. Also, magnetic region 15 has a resultant magnetic moment vector 40 and magnetic region 17 has a resultant magnetic moment vector 50. Resultant magnetic moment vectors 40 and 50 are oriented along an anisotropy easy-axis in a direction that is at an angle, preferably 45°, from word line 20 and digit line 30 (See FIG. 2). Further, magnetic region 15 is a free ferromagnetic region, meaning that resultant magnetic moment vector 40 is free to rotate in the presence of an applied magnetic field. Magnetic region 17 is a pinned ferromagnetic region, meaning that resultant magnetic moment vector 50 is not free to rotate in the presence of a moderate applied magnetic field and is used as the reference layer.

While anti-ferromagnetic coupling layers are illustrated between the two ferromagnetic layers in each tri-layer structure 18, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

In the preferred embodiment, MRAM device 10 has tri-layer structures 18 that have a length/width ratio in a range of 1 to 5 for a non-circular plan. However, we illustrate a plan that is circular (See FIG. 2). MRAM device 10 is circular in shape in the preferred embodiment to minimize the contribution to the switching field from shape anisotropy and also because it is easier to use photolithographic processing to scale the device to smaller dimensions laterally. However, it will be understood that MRAM device 10 can have other shapes, such as square, elliptical, rectangular, or diamond, but is illustrated as being circular for simplicity and improved performance.

Further, during fabrication of MRAM array 3, each succeeding layer (i.e. 30, 55, 65, etc.) is deposited or otherwise formed in sequence and each MRAM device 10 may be defined by selective deposition, photolithography processing, etching, etc. in any of the techniques known in the semiconductor industry. During deposition of at least the ferromagnetic layers 45 and 55, a magnetic field is provided to set a preferred easy magnetic axis for this pair (induced anisotropy). The provided magnetic field creates a preferred anisotropy axis for magnetic moment vectors 53 and 57. The preferred axis is chosen to be at a 45° angle between word line 20 and digit line 30, as will be discussed presently.

Figure 2:
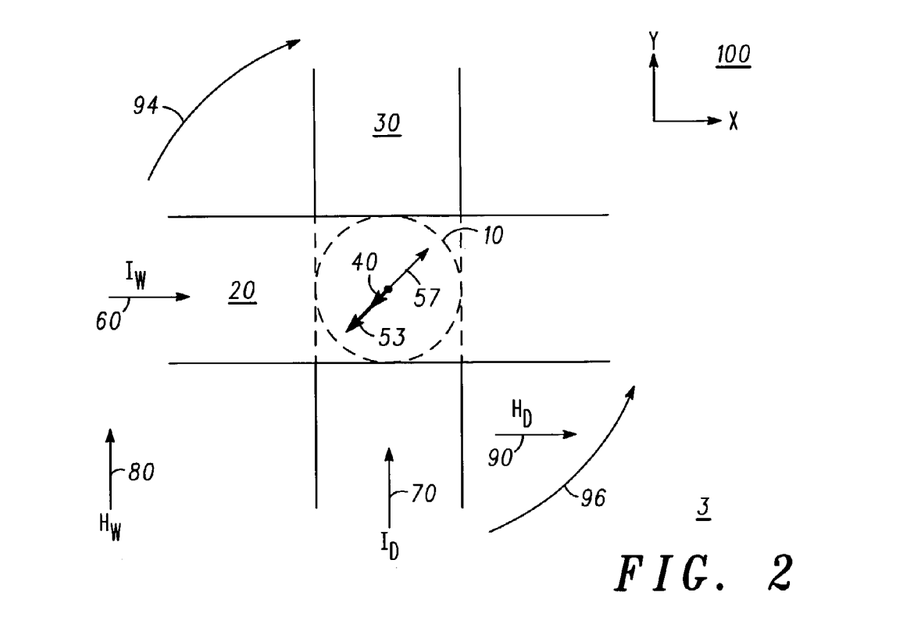
FIG. 2 is a simplified plan view of a magnetoresistive random access memory device with word and digit lines.

Turn now to FIG. 2, which illustrates a simplified plan view of a MRAM array 3 in accordance with the present invention. To simplify the description of MRAM device 10, all directions will be referenced to an x- and y-coordinate system 100 as shown and to a clockwise rotation direction 94 and a counter-clockwise rotation direction 96. To further simplify the description, it is again assumed that N is equal to two so that MRAM device 10 includes one tri-layer structure in region 15 with magnetic moment vectors 53 and 57, as well as resultant magnetic moment vector 40. Also, only the magnetic moment vectors of region 15 are illustrated since they will be switched.

To illustrate how the writing methods work, it is assumed that a preferred anisotropy axis for magnetic moment vectors 53 and 57 is directed at a 45° angle relative to the negative x- and negative y-directions and at a 45° angle relative to the positive x- and positive y-directions. As an example, FIG. 2 shows that magnetic moment vector 53 is directed at a 45° angle relative to the negative x- and negative y-directions. Since magnetic moment vector 57 is generally oriented anti-parallel to magnetic moment vector 53, it is directed at a 45° angle relative to the positive x- and positive y-directions. This initial orientation will be used to show examples of the writing methods, as will be discussed presently.

In the preferred embodiment, a word current 60 is defined as being positive if flowing in a positive x-direction and a digit current 70 is defined as being positive if flowing in a positive y-direction. The purpose of word line 20 and digit line 30 is to create a magnetic field within MRAM device 10. A positive word current 60 will induce a circumferential word magnetic field, $H_W$ 80, and a positive digit current 70 will induce a circumferential digit magnetic field, $H_D$ 90. Since word line 20 is above MRAM device 10, in the plane of the element, $H_W$ 80 will be applied to MRAM device 10 in the positive y-direction for a positive word current 60. Similarly, since digit line 30 is below MRAM device 10, in the plane of the element, $H_D$ 90 will be applied to MRAM device 10 in the positive x-direction for a positive digit current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here.

Figure 3:
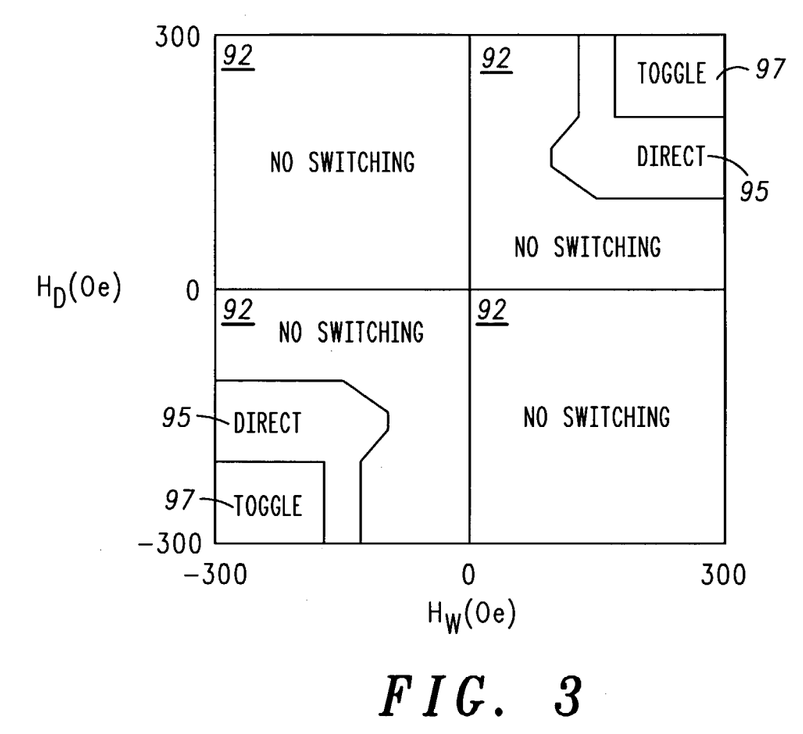
FIG. 3 is a graph illustrating a simulation of the magnetic field amplitude combinations that produce the direct or toggle write mode in the magnetoresistive random access memory device.
Figure 4:
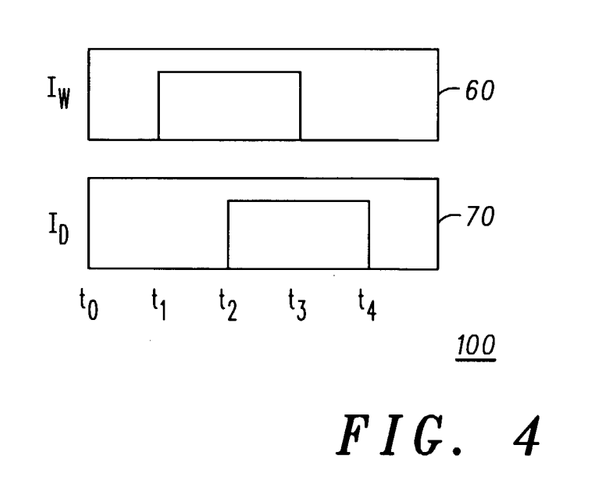

Turn now to FIG. 3, which illustrates the simulated switching behavior of a SAF tri-layer structure. The simulation consists of two single domain magnetic layers that have close to the same moment (a nearly balanced SAF) with an intrinsic anisotropy, are coupled anti-ferromagnetically, and whose magnetization dynamics are described by the Landau-Lifshitz equation. The x-axis is the word line magnetic field amplitude in Oersteds, and the y-axis is the digit line magnetic field amplitude in Oersteds. The magnetic fields are applied in a pulse sequence 100 as shown in FIG. 4 wherein pulse sequence 100 includes word current 60 and digit current 70 as functions of time.

There are three regions of operation illustrated in FIG. 3. In a region 92 there is no switching. For MRAM operation in a region 95, the direct writing method is in effect. When using the direct writing method, there is no need to determine the initial state of the MRAM device because the state is only switched if the state being written is different from the state that is stored. The selection of the written state is determined by the direction of current in both word line 20 and digit line 30. For example, if a '1' is desired to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the word and digit lines. Hence, either state can be programmed to the desired '1' or '0' with the appropriate polarity of current pulses, regardless of its initial state. Throughout this disclosure, operation in region 95 will be defined as "direct write mode".

For MRAM operation in a region 97, the toggle writing method is in effect. When using the toggle writing method, there is a need to determine the initial state of the MRAM device before writing because the state is switched every time the MRAM device is written to, regardless of the direction of the currents as long as the same polarity current pulses are chosen for both word line 20 and digit line 30. For example, if a '1' is initially stored then the state of the device will be switched to a '0' after one positive current pulse sequence is flowed through the word and digit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device. Throughout this disclosure, operation in region 97 will be defined as "toggle write mode".

Both writing methods involve supplying currents in word line 20 and digit line 30 such that magnetic moment vectors 53 and 57 can be oriented in one of two preferred directions as discussed previously. To fully elucidate the two switching modes, specific examples describing the time evolution of magnetic moment vectors 53, 57, and 40 are now given.

Figure 5:
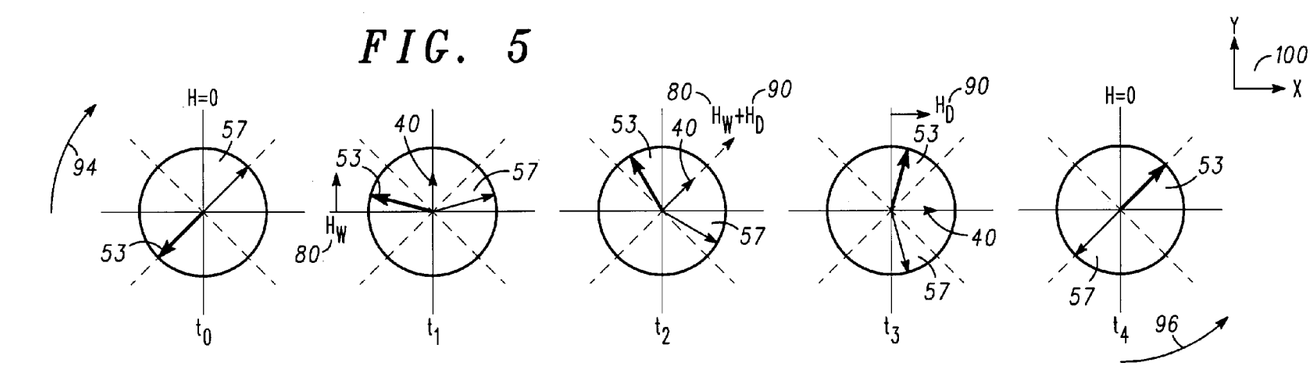
FIG. 5 is a diagram illustrating the rotation of the magnetic moment vectors for a magnetoresistive random access memory device for the toggle write mode when writing a '1' to a '0'.

Turn now to FIG. 5 which illustrates the toggle write mode for writing a '1' to a '0' using pulse sequence 100. In this illustration at time $t_0$, magnetic moment vectors 53 and 57 are oriented in the preferred directions as shown in FIG. 2. This orientation will be defined as a '1'.

At a time $t_1$, a positive word current 60 is turned on, which induces $H_W$ 80 to be directed in the positive y-direction. The effect of positive $H_W$ 80 is to cause the nearly balanced anti-aligned MRAM tri-layer to "FLOP" and become oriented approximately 90° to the applied field direction. The finite anti-ferromagnetic exchange interaction between ferromagnetic layers 45 and 55 will allow magnetic moment vectors 53 and 57 to now deflect at a small angle toward the magnetic field direction and resultant magnetic moment vector 40 will subtend the angle between magnetic moment vectors 53 and 57 and will align with $H_W$ 80. Hence, magnetic moment vector 53 is rotated in clockwise direction 94. Since resultant magnetic moment vector 40 is the vector addition of magnetic moment vectors 53 and 57, magnetic moment vector 57 is also rotated in clockwise direction 94.

At a time $t_2$, positive digit current 70 is turned on, which induces positive $H_D$ 90. Consequently, resultant magnetic moment vector 40 is being simultaneously directed in the positive y-direction by $H_W$ 80 and the positive x-direction by $H_D$ 90, which has the effect of causing effective magnetic moment vector 40 to further rotate in clockwise direction 94 until it is generally oriented at a 45° angle between the positive x- and positive y-directions. Consequently, magnetic moment vectors 53 and 57 will also further rotate in clockwise direction 94.

At a time $t_3$, word current 60 is turned off so that now only $H_D$ 90 is directing resultant magnetic moment vector 40, which will now be oriented in the positive x-direction. Both magnetic moment vectors 53 and 57 will now generally be directed at angles passed their anisotropy hard-axis instability points.

At a time $t_4$, digit current 70 is turned off so a magnetic field force is not acting upon resultant magnetic moment vector 40. Consequently, magnetic moment vectors 53 and 57 will become oriented in their nearest preferred directions to minimize the anisotropy energy. In this case, the preferred direction for magnetic moment vector 53 is at a 45° angle relative to the positive y- and positive x-directions. This preferred direction is also 180° from the initial direction of magnetic moment vector 53 at time $t_0$ and is defined as '0'. Hence, MRAM device 10 has been switched to a '0'. It will be understood that MRAM device 10 could also be switched by rotating magnetic moment vectors 53, 57, and 40 in counter clockwise direction 96 by using negative currents in both word line 20 and digit line 30, but is shown otherwise for illustrative purposes.

Figure 6:
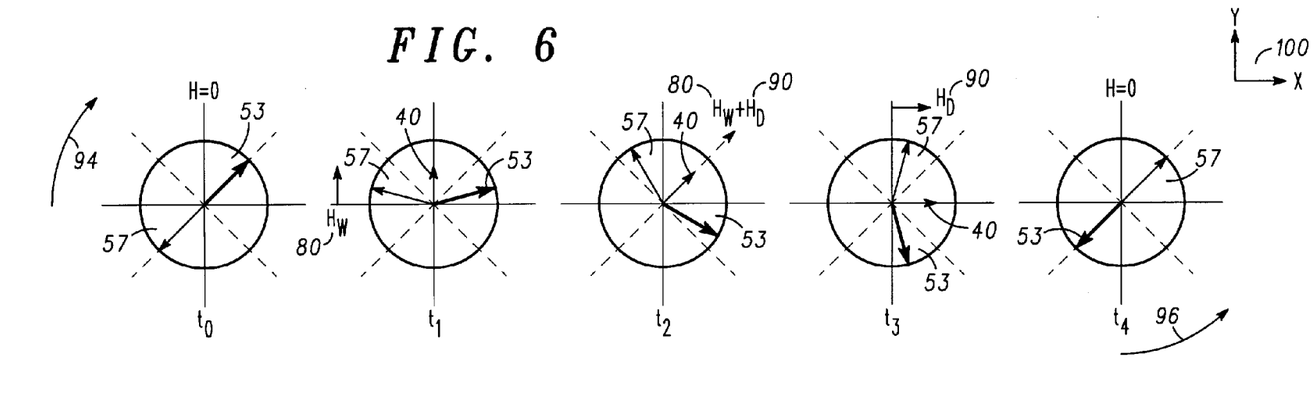
FIG. 6 is a diagram illustrating the rotation of the magnetic moment vectors for a magnetoresistive random access memory device for the toggle write mode when writing a '0' to a '1'.

Turn now to FIG. 6 which illustrates the toggle write mode for writing a '0' to a '1' using pulse sequence 100. Illustrated are the magnetic moment vectors 53 and 57, as well as resultant magnetic moment vector 40, at each of the times $t_0$, $t_1$, $t_2$, $t_3$, and $t_4$ as described previously showing the ability to switch the state of MRAM device 10 from '0' to '1' with the same current and magnetic field directions. Hence, the state of MRAM device 10 is written to with toggle write mode, which corresponds to region 97 in FIG. 3.

For the direct write mode, it is assumed that magnetic moment vector 53 is larger in magnitude than magnetic moment vector 57, so that magnetic moment vector 40 points in the same direction as magnetic moment vector 53, but has a smaller magnitude in zero field. This unbalanced moment allows the dipole energy, which tends to align the total moment with the applied field, to break the symmetry of the nearly balanced SAF. Hence, switching can occur only in one direction for a given polarity of current.

Figure 7:
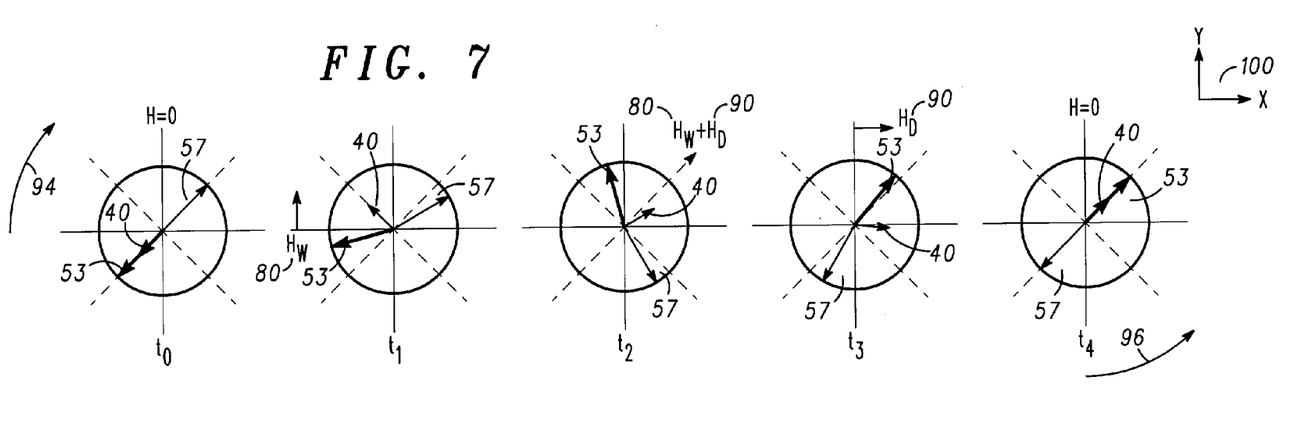
FIG. 7 is a graph illustrating the rotation of the magnetic moment vectors for a magnetoresistive random access memory device for the direct write mode when writing a '1' to a '0'.

Turn now to FIG. 7 which illustrates an example of writing a '1' to a '0' using the direct write mode using pulse sequence 100. Here again, the memory state is initially a '1' with magnetic moment vector 53 directed 45° with respect to the negative x- and negative y-directions and magnetic moment vector 57 directed 452 with respect to the positive x- and positive y-directions. Following the pulse sequence as described above with positive word current 60 and positive digit current 70, the writing occurs in a similar manner as the toggle write mode as described previously. Note that the moments again 'FLOP' at a time $t_1$, but the resulting angle is canted from 90° due to the unbalanced moment and anisotropy. After time $t_4$, MRAM device 10 has been switched to the '0' state with resultant magnetic moment 40 oriented at a 45° angle in the positive x- and positive y-directions as desired. Similar results are obtained when writing a '0' to a '1' only now with negative word current 60 and negative digit current 70.

Figure 8:
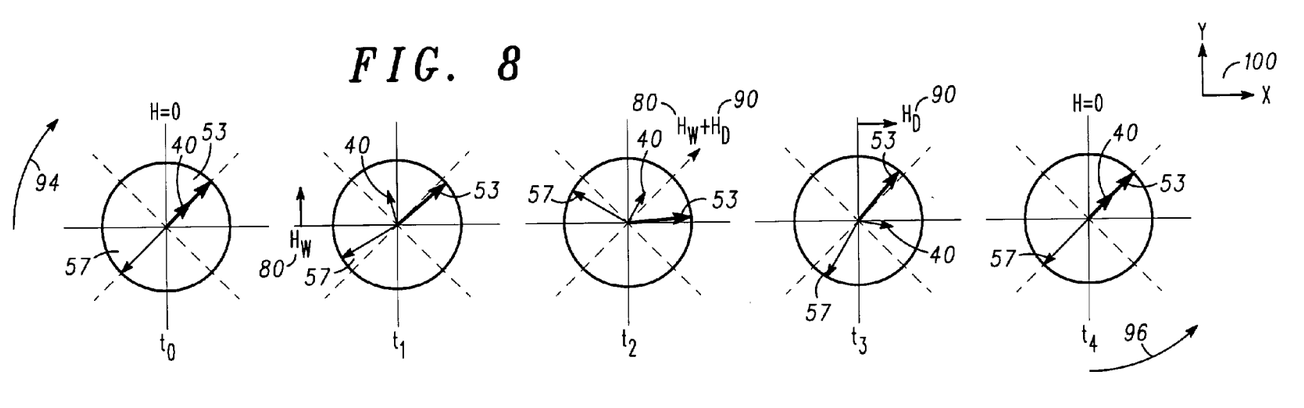
FIG. 8 is a graph illustrating the rotation of the magnetic moment vectors for a magnetoresistive random access memory device for the direct write mode when writing a '0' to a state that is already a '0'.

Turn now to FIG. 8 which illustrates an example of writing using the direct write mode when the new state is the same as the state already stored. In this example, a '0' is already stored in MRAM device 10 and current pulse sequence 100 is now repeated to store a '0'. Magnetic moment vectors 53 and 57 attempt to "FLOP" at a time $t_1$, but because the unbalanced magnetic moment must work against the applied magnetic field, the rotation is diminished. Hence, there is an additional energy barrier to rotate out of the reverse state. At time $t_2$, the dominant moment 53 is nearly aligned with the positive x-axis and less than 45° from its initial anisotropy direction. At a time $t_3$, the magnetic field is directed along the positive x-axis. Rather than rotating further clockwise, the system now lowers its energy by changing the SAF moment symmetry with respect to the applied field. The passive moment 57 crosses the x-axis and the system stabilizes with the dominant moment 53 returned to near its original direction. Therefore, at a time $t_4$ when the magnetic field is removed, and the state stored in MRAM device 10 will remain a '0'. This sequence illustrates the mechanism of the direct write mode shown as region 95 in FIG. 3. Hence, in this convention, to write a '0' requires positive current in both word line 60 and digit line 70 and, conversely, to write a '1' negative current is required in both word line 60 and digit line 70.

If larger fields are applied, eventually the energy decrease associated with a flop and scissor exceeds the additional energy barrier created by the dipole energy of the unbalanced moment which is preventing a toggle event. At this point, a toggle event will occur and the switching is described by region 97.

Region 95 in which the direct write mode applies can be expanded, i.e. toggle mode region 97 can be moved to higher magnetic fields, if the times $t_3$ and $t_4$ are equal or made as close to equal as possible. In this case, the magnetic field direction starts at 45° relative to the bit anisotropy axis when word current 60 turns on and then moves to parallel with the bit anisotropy axis when digit current 70 turns on. This example is similar to the typical magnetic field application sequence. However, now word current 60 and digit current 70 turn off substantially simultaneously, so that the magnetic field direction does not rotate any further. Therefore, the applied field must be large enough so that the resultant magnetic moment vector 40 has already moved past its hard-axis instability point with both word current 60 and digit current 70 turned on. A toggle writing mode event is now less likely to occur, since the magnetic field direction is now rotated only 45°, instead of 90° as before. An advantage of having substantially coincident fall times, $t_3$ and $t_4$, is that now there are no additional restrictions on the order of the field rise times $t_1$ and $t_2$. Thus, the magnetic fields can be turned on in any order or can also be substantially coincident.

Figure 9:
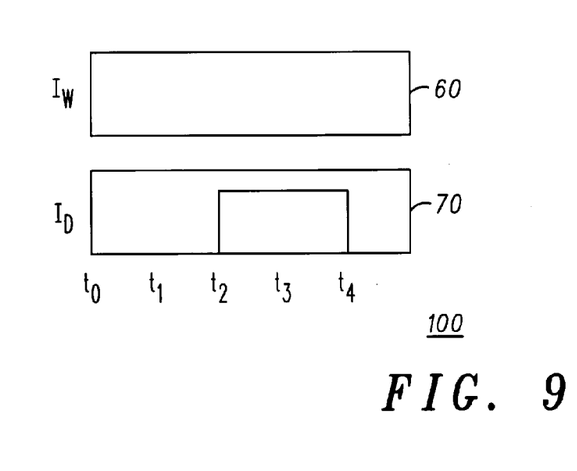
Figure 10:
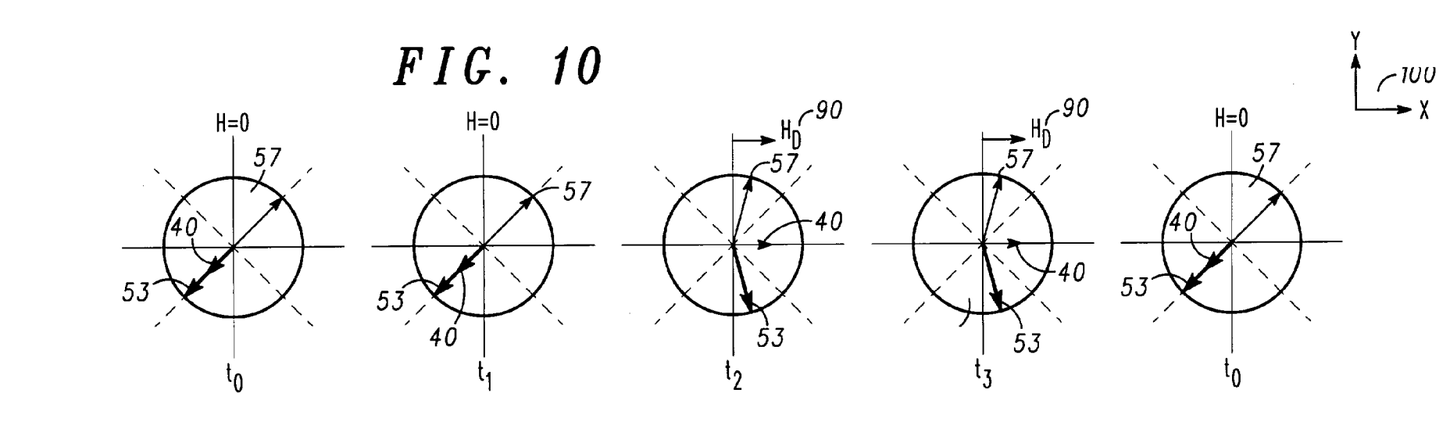

The writing methods described previously are highly selective because only the MRAM device that has both word current 60 and digit current 70 turned on between time $t_2$ and time $t_3$ will switch states. This feature is illustrated in FIGS. 9 and 10. FIG. 9 illustrates pulse sequence 100 when word current 60 is not turned on and digit current 70 is turned on. FIG. 10 illustrates the corresponding behavior of the state of MRAM device 10. At a time $t_0$, magnetic moment vectors 53 and 57, as well as resultant magnetic moment vector 40, are oriented as described in FIG. 2. In pulse sequence 100, digit current 70 is turned on at a time $t_1$. During this time, $H_D$ 90 will cause resultant magnetic moment vector 40 to be directed in the positive x-direction.

Since word current 60 is never switched on, resultant magnetic moment vectors 53 and 57 are never rotated through their anisotropy hard-axis instability points. As a result, magnetic moment vectors 53 and 57 will reorient themselves in the nearest preferred direction when digit current 70 is turned off at a time $t_3$, which in this case is the initial direction at time $t_0$. Hence, the state of MRAM device 10 is not switched. It will be understood that the same result will occur if word current 60 is turned on at similar times described above and digit current 70 is not turned on. This feature ensures that only one MRAM device in an array will be switched, while the other devices will remain in their initial states. As a result, unintentional switching is avoided and the bit error rate is minimized.

Various changes and modifications to the embodiments herein chosen for purposes of illustration will readily occur Having fully described the invention in such clear and concise terms as to enable those skilled in the art to understand and practice the same, the invention claimed is:

1. A magnetoresistive memory may comprising:
   a first conductor;
   a second conductor;
   a magnetoresistive memory device contiguous to the first conductor and the second conductor, the magnetoresistive memory device including:
   a pinned magnetic region;
   a tunneling barrier; and
   a free magnetic region separated from the pinned magnetic region by the tunneling barrier, the free magnetic region including:
   N ferromagnetic layers that are coupled antiferromagnetically, where N is an integer greater than or equal to two, and where the N layers define a volume and each layer of the N layers has a magnetic moment adjusted to provide a toggle write mode at an operating current such that the current in each of the first and second conductors is pulsed with a same polarity to write a state and the current in each of the first and second conductors is pulsed with the same polarity to reverse the state.

2. The magnetoresistive memory array as claimed in claim 1 further comprising an anti-ferromagnetic coupling material separating the N layers.

3. The magnetoresistive memory array as claimed in claim 2, wherein the antiferromagnetic coupling material has a thickness in a range of approximately 4 Å to 30 Å.

4. The magnetoresistive memory array as claimed in claim 2 wherein the anti-ferromagnetic coupling material comprises a material selected from the group consisting of Ru, Os, Re, Cr, Rh, Cu, and any combination thereof.

5. The magnetoresistive memory array as claimed in claim 1 wherein the first and second conductors are oriented at approximately a 90° angle relative to each other.

6. The magnetoresistive memory array as claimed in claim 1 wherein the layers of ferromagnetic material comprises a material selected from the group consisting of Ni, Fe, Mn, Ca, and combinations thereof.

7. The magnetoresistive memory array as claimed in claim 6, wherein each layer of the N layers have a thickness in a range of approximately 15 Å to 100 Å.

8. The magnetoresistive memory array as claimed in claim 1 wherein the magnetoresistive memory element comprises an element with a substantially circular cross section.

9. The magnetoresistive array comprising:
   a first conductor;
   a second conductor;
   a magnetoresistive device adjacent to the first and second conductors, the magnetoresistive device comprising:
   a first magnetic region;
   a tunneling barrier; and
   a second magnetic region separated from the first magnetic region by the tunneling barrier, the second magnetic region comprising a multi-layer structure having a magnetic moment oriented along an anisotropy easy-axis in a direction that is at an angle with respect to said first and second conductor and a magnetic moment fractional balance ratio ($M_{br}$) with a magnitude in a range of about $0 \leq |M_{br}| \leq 0.1$.

10. The magnetoresistive array as claimed in claim 9, wherein said angle is about forty-five degrees (45°).

11. The magnetoresistive array as claimed in claim 9, wherein said magnetic moment is a resultant magnetic moment of a plurality of magnetic moments of said N layer structure.

12. The magnetoresistive array as claimed in claim 9, wherein the multi-layer structure is a synthetic anti-ferromagnetic layer material.

13. The magnetoresistive array as claimed in claim 9, wherein the multi-layer structure comprises N anti-ferromagentically coupled layers of a ferromagnetic material, where N is an integer greater than or equal to two.

14. The magnetoresistive array as claimed in claim 9, wherein the multi-layer structure comprises:
   a first ferromagnetic layer;
   a second ferromagnetic layer; and
   an anti-ferromagnetic layer interposed between said first and second ferromagnetic layer.

15. The magnetoresistive array as claimed in claim 14, wherein the anti-ferromagnetic layer comprises a material selected from the group consisting one of Ru, Os, Re, Cr, Rh, and Cu, and any combination thereof.

16. The magnetoresistive memory array as claimed in claim 14, wherein the first ferromagnetic material comprises a material selected from the group consisting of Ni, Fe, Mn, Co, and combinations thereof.

17. The magnetoresistive memory array as claimed in claim 14, wherein the second ferromagnetic material comprises a material selected from the group consisting of Ni, Fe, Mn, Co, and combinations thereof.

18. The magnetoresistive array as claimed in claim 9, wherein the multi-layer structure comprises:
   a first ferromagnetic layer;
   a second ferromagnetic layer;
   a first anti-ferromagnetic layer interposed between said first and second ferromagnetic layer;
   a third ferromagnetic layer; and
   a second anti-ferromagnetic layer interposed between said second and third ferromagnetic layer.

19. The magnetoresistive array as claimed in claim 9, wherein the multi-layer structure is a free ferromagnetic region.

20. The magnetoresistive array as claimed in claim 9, wherein the first conductor is at an angle of about ninety degree (90°) with respect to the second conductor.

21. The magnetoresistive array as claimed in claim 9, wherein the first magnetic region comprises:
   a first ferromagnetic layer;
   a second ferromagnetic layer; and
   an anti-ferromagnetic layer interposed between said first and second ferromagnetic layer.

22. The magnetoresistive array as claimed in claim 21, wherein the anti-ferromagnetic layer comprises a material selected from the group consisting one of Ru, Os, Re, Cr, Rh, and Cu, and any combination thereof.

23. The magnetoresistive memory array as claimed in claim 21, wherein the first ferromagnetic material comprises a material selected from the group consisting of Ni, Fe; Mn, Co, and combinations thereof.

24. The magnetoresistive memory array as claimed in claim 21, wherein the second ferromagnetic material comprises a material selected from the group consisting of Ni, Fe, Mn, Co, and combinations thereof.

25. The magnetoresistive array as claimed in claim 9, wherein the first magnetic region is a pinned magnetic region.

26. The magnetoresistive array as claimed in claim 9, wherein the multi-layer structure comprises:
   a first ferromagnetic layer;
   a second ferromagnetic layer; and
   a magnetostatic flux closure coupling said first and second ferromagnetic layers.

27. The magnetoresistive array as claimed in claim 9, wherein the magnetoresistive device has a length/width ratio in a range of about one (1) to five (5).

28. The magnetoresistive array as claimed in claim 9, wherein a shape of the magnetoresistive device is substantially elliptical.

29. The magnetoresistive array as claimed in claim 28, wherein the shape of the magnetoresistive device is substantially circular.

30. The magnetoresistive array as claimed in claim 14, wherein the anti-ferromagnetic layer has a thickness in a range of approximately 4 Å to 30 Å.

31. The magnetoresistive array as claimed in claim 13, wherein the N anti-ferromagentically coupled layers of the ferromagnetic material have a thickness in a range of approximately 15 Å to 100 Å.

32. The magnetoresistive array as claimed in claim 9, wherein the magnetic moment is configured to reorient from a first direction to a second direction when:
   a first magnetic field is produced by the first conductor at a first time ($t_1$);
   a second magnetic field is produced by the second conductor at a second time ($t_2$);
   the first magnetic field produced by the first conductor is substantially terminated at a third time ($t_3$); and
   the second magnetic field produced by the second conductor is substantially terminated at a fourth time ($t_4$).

33. The magnetoresistive array as claimed in claim 32, wherein $t_1 < t_2 < t_3 \leq t_4$.

34. The magnetoresistive array as claimed in claim 32, wherein the magnetic moment is configured to reorient from the second direction to the first direction when:
   a third magnetic field is produced by the first conductor at a fifth ($t_5$);
   a fourth magnetic field is produced by the second conductor at a sixth time ($t_6$);
   the third magnetic field produced by the first conductor is substantially terminated at a seventh time ($t_7$); and
   the fourth magnetic field produced by the second conductor is substantially terminated at an eighth time ($t_8$).

35. The magnetoresistive array as claimed in claim 34, wherein $t_5 < t_6 < t_7 \leq t_8$.

36. The magnetoresistive array as claimed in claim 34, wherein the magnetic moment is configured to reorient from the first direction to the second direction and reorient from the second direction to the first direction if the first magnetic field, second magnetic field, third magnetic field and fourth magnetic field have the same polarity.

37. The magnetoresistive array as claimed in claim 34, wherein the magnetic moment is configured to reorient from the first direction to the second direction only if both the first magnetic field and the second magnetic field have a first polarity and reorient from the second direction to the first direction only if both of the third magnetic field and the fourth magnetic field have a second polarity other than the first polarity.

38. The magnetoresistive array as claimed in claim 9, further comprising a circuit configured to:
   read an initial state of the magnetoresistive device;
   compare the initial state with a new state to be written in the magnetoresistive device; and
   initiate a writing of the magnetoresistive device only if the new state to be written is different from the initial state.

39. The magnetoresistive array as claimed in claim 9, wherein only uni-polar voltages are utilized to drive the magnetoresistive device.

40. The magnetoresistive array, as claimed in claim 9, wherein the second magnetic region has a first magnetic moment and a second magnetic moment and the first magnetic moment has a first magnitude and the second magnetic moment has a second magnitude that is less than said first magnitude.

41. A magnetoresistive memory array comprising:
   a first conductor;
   a second conductor;
   a magnetoresistive memory device proximate to the first conductor and the second conductor, the magnetoresistive memory device comprising:
     a first magnetic region;
     a tunneling barrier; and
     a second magnetic region separated from the first magnetic region by the tunneling barrier, the second magnetic region comprising a multi-layer structure having a magnetic moment orientation in a first direction at a time $t_0$,
   wherein applying a first current pulse with a first polarity to the first conductor at a time $t_1$ after the time $t_0$ and substantially turning off the first current pulse at a time $t_3$ after a time $t_2$ white additionally applying a second current pulse with the first polarity to the second conductor at the time $t_2$, after the time $t_1$ and substantially turning off the second current pulse at a time $t_4$ after the time $t_3$ results in the magnetic moment orientation changing to a second direction and applying a third current pulse with the first polarity to the first conductor at a time $t_5$ after the time $t_4$ and substantially turning off the third current pulse at a time $t_7$ after a time $t_6$ while additionally applying a fourth current pulse with the first polarity to the second conductor at the time $t_6$ after the time $t_5$ and substantially turning off the second current pulse at a time $t_8$ after the time $t_7$ results in the magnetic moment orientation changing to the first direction.

42. A magnetoresistive memory array comprising:
   a first conductor;
   a second conductor;
   a magnetoresistive memory device proximate to the first conductor and the second conductor, the magnetoresistive memory device comprising:
     a first magnetic region;
     a tunneling barrier; and
     a second magnetic region separated from the first magnetic region by the tunneling barrier, the second magnetic region comprising a multi-layer structure having a magnetic moment orientation in a first direction at a time $t_0$, wherein the magnetic moment orientation reorients from the first direction to a second direction when:
   a first current having a first polarity is applied to the first conductor at a time $t_1$ after the time $t_0$;
   a second current having the first polarity is applied to the second conductor at a time $t_2$ after the time $t_1$;
   the first current is at least substantially discontinued at a time $t_3$ after the time $t_2$; and the second current is at least substantially discontinued at a time $t_4$ after the time $t_3$, and wherein the magnetic moment orientation changes from the second direction to the first direction when:

a third current having the first polarity is applied to the first conductor at a time $t_5$ after the time $t_4$;

a fourth current having the first polarity is applied to the second conductor at a time $t_6$ after the time $t_5$;

the third current is substantially discontinued at a time $t_7$ after the time $t_6$ and the fourth current is substantially discontinued at a time $t_8$ after the time $t_7$.

43. The magnetoresistive memory array as claimed in claim 42, wherein $t_1<t_2<t_3<t_4<t_5<t_6<t_7<t_8$.

* * * * *

UNITED STATES PATENT AND TRADEMARK OFFICE
CERTIFICATE OF CORRECTION

PATENT NO.         : 7,184,300 B2
APPLICATION NO. : 10/339378
DATED              : February 27, 2007
INVENTOR(S)       : Savtchenko et al.

It is certified that error appears in the above-identified patent and that said Letters Patent is hereby corrected as shown below:

Column 11 line 9, "may" should be changed to --array--
Column 12, line 2, the mathematical fomula should appear as follows:
--$0 \leq |M_{br}| \leq 0.1$--;
Column 13 line 38, the mathematical formula should appear as follows:
-- $t_1 < t_2 < t_3 \leq t_4$ --;

Column 13 line 51 the mathematical formula should appear as follows:
-- $t_5 < t_6 < t_7 \leq t_8$ --.

Signed and Sealed this

Seventeenth Day of April, 2007

JON W. DUDAS
*Director of the United States Patent and Trademark Office*